United States Patent [19]

Prall

[11] Patent Number: 5,281,548

[45] Date of Patent: Jan. 25, 1994

[54] PLUG-BASED FLOATING GATE MEMORY

[75] Inventor: Kirk D. Prall, Boise, Id.

[73] Assignee: Micron Technology, Inc., Boise, Id.

[21] Appl. No.: 920,793

[22] Filed: Jul. 28, 1992

[51] Int. Cl.⁵ .................. H01L 21/76; H01L 27/115
[52] U.S. Cl. ...................................... 437/43; 437/203; 257/315
[58] Field of Search .............................. 437/43, 48, 52

[56] References Cited

U.S. PATENT DOCUMENTS

| | | | |
|---|---|---|---|
| 4,964,143 | 10/1990 | Haskell | 357/23.5 |
| 4,975,384 | 12/1990 | Baglee | 437/43 |
| 5,045,490 | 9/1991 | Esquivel et al. | 437/43 |
| 5,135,879 | 8/1992 | Richardson | 437/43 |
| 5,141,886 | 8/1992 | Mori | 437/43 |

Primary Examiner—Olik Chaudhuri
Assistant Examiner—Richard A. Booth

Attorney, Agent, or Firm—Hopkins, French, Crockett, Springer & Hoopes

[57] ABSTRACT

A device and a method of forming a floating gate memory transistor of very small area, thereby allowing a high-density integrated circuit chip, more specifically for Erasable Programmable Read-Only Memory (EPROM) or similar non-volatile devices.

In a first embodiment, a method is disclosed that fabricates a programmable memory cell described as a "diffusion cut" cell where a plug-type floating gate contact hole cuts through a diffusion region and partially into a substrate region. In a second embodiment, a method is disclosed that fabricates a programmable memory cell described as an "oxide cut" cell, where the plug-type floating gate contact hole only penetrates a silicon oxide layer. This "oxide cut" cell is formed in a similar fashion except penetration does not go into the diffusion region or substrate.

2 Claims, 4 Drawing Sheets

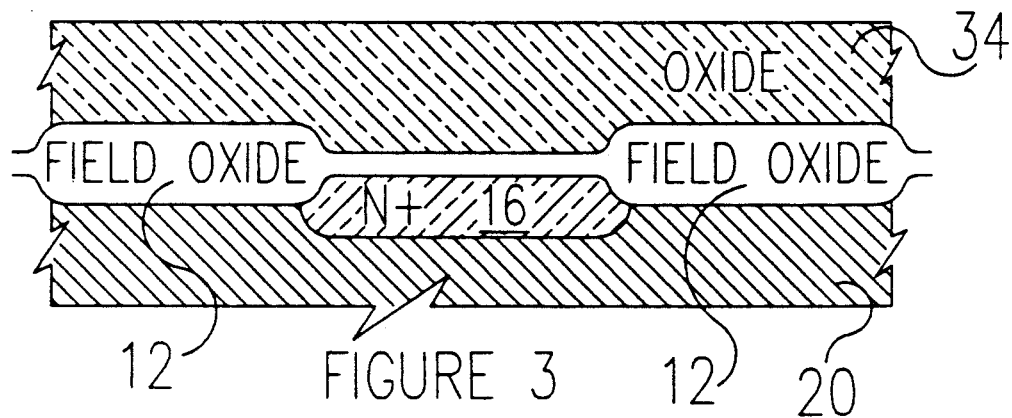
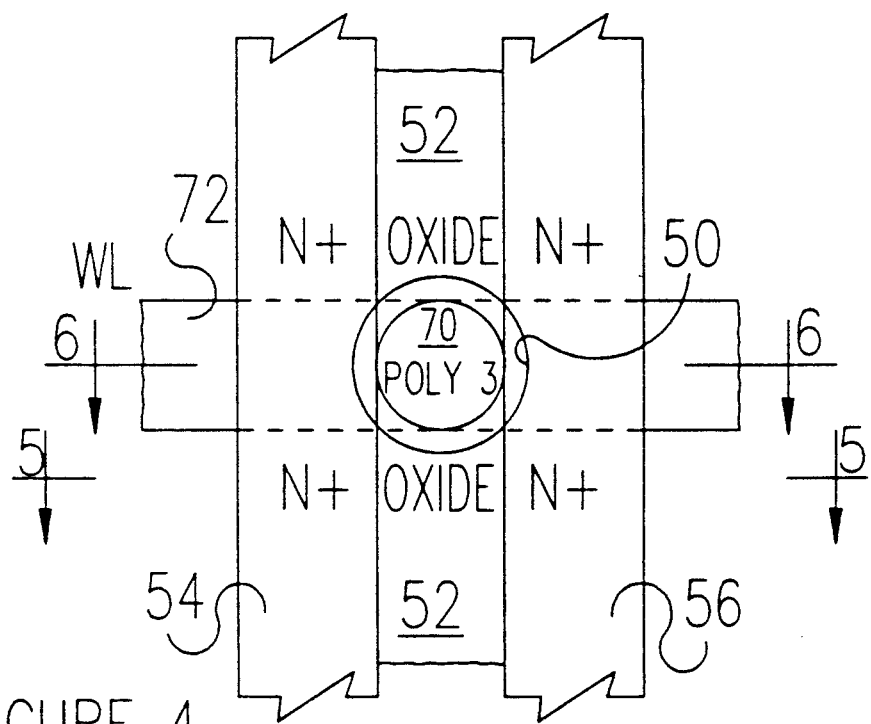
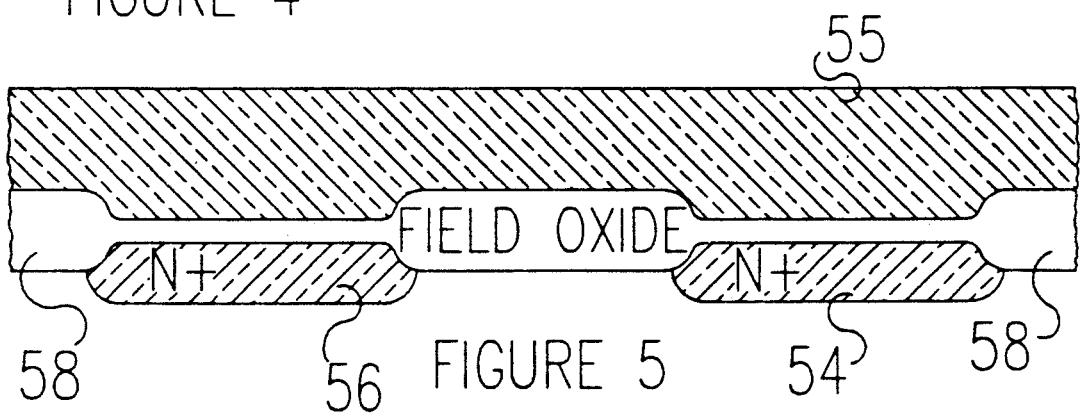

PLUG-BASED FLOATING GATE MEMORY

FIELD OF THE INVENTION

This invention relates to a device and a method of forming a floating gate memory transistor of very small area, thereby allowing a high-density integrated circuit chip, more specifically for Erasable Programmable Read-Only Memory (EPROM) or similar non-volatile devices.

BACKGROUND OF THE INVENTION

The non-volatile memory function of EPROM memories is based on the storage of charge. EPROM memory transistors are all of the floating gate type, which means that the charge is stored on an additional polysilicon layer, located between the control gate and the substrate of a transistor. This type of memory cell can consist of only one transistor. The presence or absence of charge on the floating gate determines whether the cell will conduct current or not, which defines the two logic states. Present EPROM devices all use channel hot electron (CHE) injection to bring electrons onto the floating gate, and ultra-violet (UV) light is used to erase the memory. CHE injection programming is accomplished by applying a higher voltage (12 V) to the cell control gate. CHE programming is also used to store charge on flash-EPROMs. Another non-volatile memory floating gate device is the electrically erasable read-only memory (EEPROM) which is also programmed with the 12 volt gate signal.

In the IC chip industry, it is a continuing objective to reduce the size of each individual cell to allow packing more devices on a single chip, i.e., higher density. Since it has become clear that CHE programmable transistors are to be used in high-density EPROMs, technology has been adapted in order to yield fast-programmable, high-density floating gate EPROM structures. The efficiency of the CHE programming process is largely dependent on substrate (and drain junction) doping level, effective channel length, and floating gate-drain junction overlap. One method that can achieve high density is by using the self-aligned double polysilicon stacked gate structure, in which the drain/source junctions are self-aligned with respect to the floating gate and in which the double polysilicon stacked gate structure is etched in one step, usually by means of an anisotropic dry etching process.

There are certain problems associated with extremely short channels. Included in these so-called "short channel effects" are: (1) failure of the drain current to saturate at large $V_{DS}$; (2) increased subthreshold current; (3) reduction of threshold voltage $V_t$; and (4) in the extreme, a loss of the ability of the gate to control gain. Consequently, much of the present-date MOSFET design effort is devoted to producing transistors that are physically small but still exhibit the electrical characteristics similar to those of physically long channels.

It is the purpose of this invention to provide a memory cell of minimal surface area, i.e., one square micron or less, yet maintain the electrical characteristics of a larger area device.

SUMMARY OF THE INVENTION

In first embodiment, a method is disclosed that fabricates a programmable memory cell described as a "diffusion cut" cell where a plug-type floating gate contact hole cuts through a diffusion region and partially into a substrate region.

This diffusion cut cell is formed in an IC chip contact well by the following method:

growing and patterning a field oxide on a substrate by a LOCOS process;

implanting an impurity element in the substrate to form a diffusion region adjacent the field oxide;

depositing an oxide layer over the diffusion region and field oxide;

patterning and etching a contact well in the oxide layer, field oxide, diffusion region, and substrate;

growing a gate/tunnel oxide layer within the contact well;

depositing and doping a first polysilicon layer within the contact well thereby forming a floating gate and capacitor, C1, between the first polysilicon layer and the substrate, said capacitor C1 having a minimal capacitance;

etching the first polysilicon layer until the only polysilicon is within the contact well forming a poly plug;

depositing a second polysilicon layer within the contact well;

etching back the second poly layer leaving a thin layer of the second poly on a perimeter of the contact well;

depositing an ONO dielectric over the second polysilicon layer;

depositing and doping a third polysilicon layer over the contact well, thereby forming a second capacitor, C2, between the third polysilicon layer and the second polysilicon layer, C2, having a larger capacitance than C1;

depositing a tungsten silicide layer over the third polysilicon layer; and then masking and etching the third polysilicon layer to form a control gate and word line.

In this embodiment, the channel length $I_{eff}$ under the floating gate can be controlled based on the depth of penetration into the substrate by the contact well. This also controls the floating gate to substrate capacitance, C1. The floating gate to control gate capacitance C2 can be controlled by the depth of an oxide and second polysilicon layer. These effects will be described later.

In a second embodiment, a method is disclosed that fabricates a programmable memory cell described as an "oxide cut" cell, where the plug-type floating gate contact hole only penetrates a silicon oxide layer. This "oxide cut" cell is formed in a similar fashion except penetration does not go into the diffusion region or substrate. In this embodiment, the capacitance C2 (control gate to floating gate) is again a function of depth of the oxide and second polysilicon layer.

It is the purpose of this invention to disclose a minimum area programmable floating gate memory cell of the MOS FET type of device that is based on a plug-type construction and has maximum charge storing capacity while maintaining this minimum area per cell.

Other objects, advantages, and capabilities of the present invention will become more apparent as the description proceeds.

BRIEF DESCRIPTION OF THE DRAWINGS

FIG. 3 is a section view of the memory cell taken along lines 3—3 of FIG. 1;

FIG. 4 is a plan view of an oxide cut floating gate memory cell of the present invention;

FIG. 5 is a section view of the oxide cut memory cell taken along lines 5—5 of FIG. 4;

DETAILED DESCRIPTION OF THE INVENTION

Diffusion Cut Method

Figure 1:
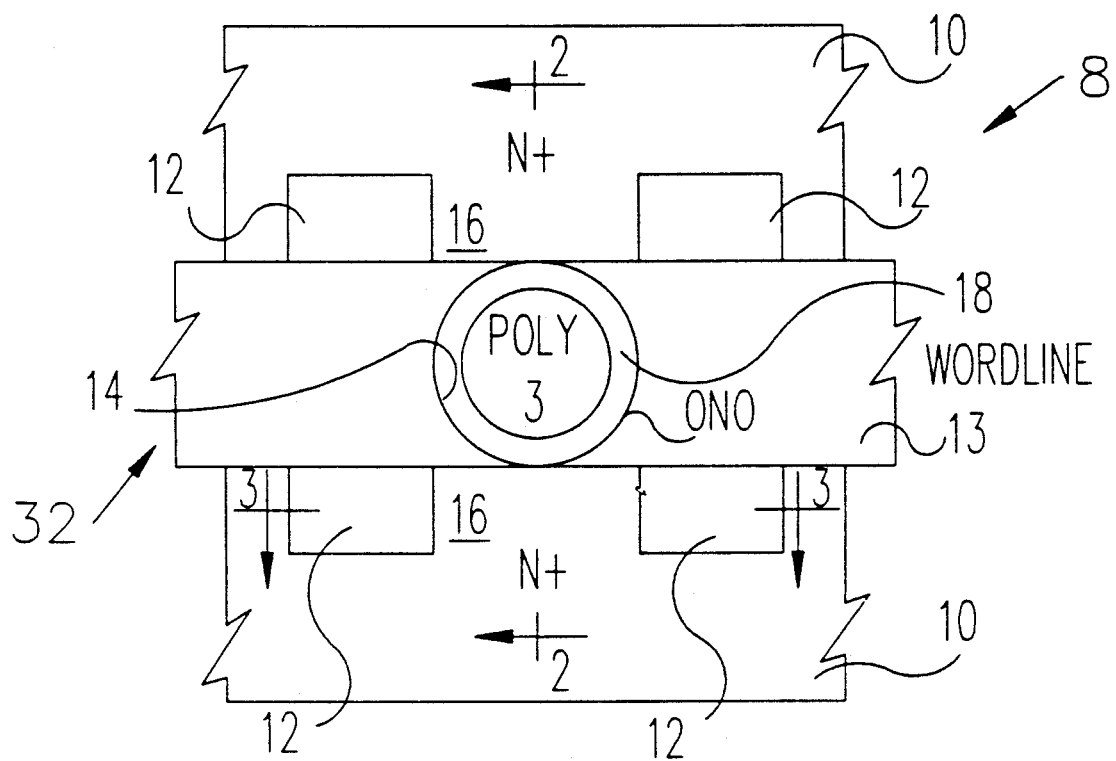
FIG. 1 is a plan view of a diffusion cut floating gate memory cell of the present invention.

A first embodiment of the floating gate memory cell 8 will be described by referring to FIGS. 1-3 which disclose a "diffusion cut" cell. FIG. 1 in plan view shows the "active" layers on a cell having diffusion regions 10, field oxide 12, and word line 13. Until the polysilicon plug contact well 14 is etched, the diffusion regions 10 are bridged by bridging diffusion 16. After patterning plug well 14, a layer of gate/tunnel oxide, three polysilicon layers, and a very thin layer of dielectric ONO (oxide, nitride, oxide) 18 are formed above the substrate within the well 14. The ONO layer is about 100 Å and its thickness varies the capacitance as will be explained later.

Referring to cell section view (FIG. 2), these layers can be more clearly seen over silicon substrate 20. A very thin gate/tunnel oxide layer 22 is formed within the well 14. Above this is the first plug-shape polysilicon layer forming floating gate 24 (labeled as Poly 1 in FIG. 1). Directly above floating gate 24 is a thin cylindrical second polysilicon layer 26 (labeled Poly 2). Within this second polysilicon layer 26 is plug-shaped third polysilicon layer 28 forming the control gate (labeled Poly 3). A layer of tungsten silicide (WSi$_x$), 30 with polysilicon layer 28 forms word line 32. In this embodiment, an oxide layer 34 is formed over the field oxide 12 and diffusion (FIGS. 2 and 3).

Superimposed over the substrate 20 and floating gate 24 is a capacitor C1 schematically shown at 36 formed between gate (capacitor plate) 36 and substrate 20 (second capacitor plate) and separated by gate/tunnel[oxide (dielectric) 22. In a similar manner, a capacitor C2 is formed between the second and third poly layers 26 and 28 as at 38.

It is important that the ratio of C2 to C1 be maximized to provide the highest voltage V$_{fg}$ for programming the cell, based on the relationship:

$$V_{fg} = V_{cg} \frac{C2}{C1 + C2}.$$

Figure 7:
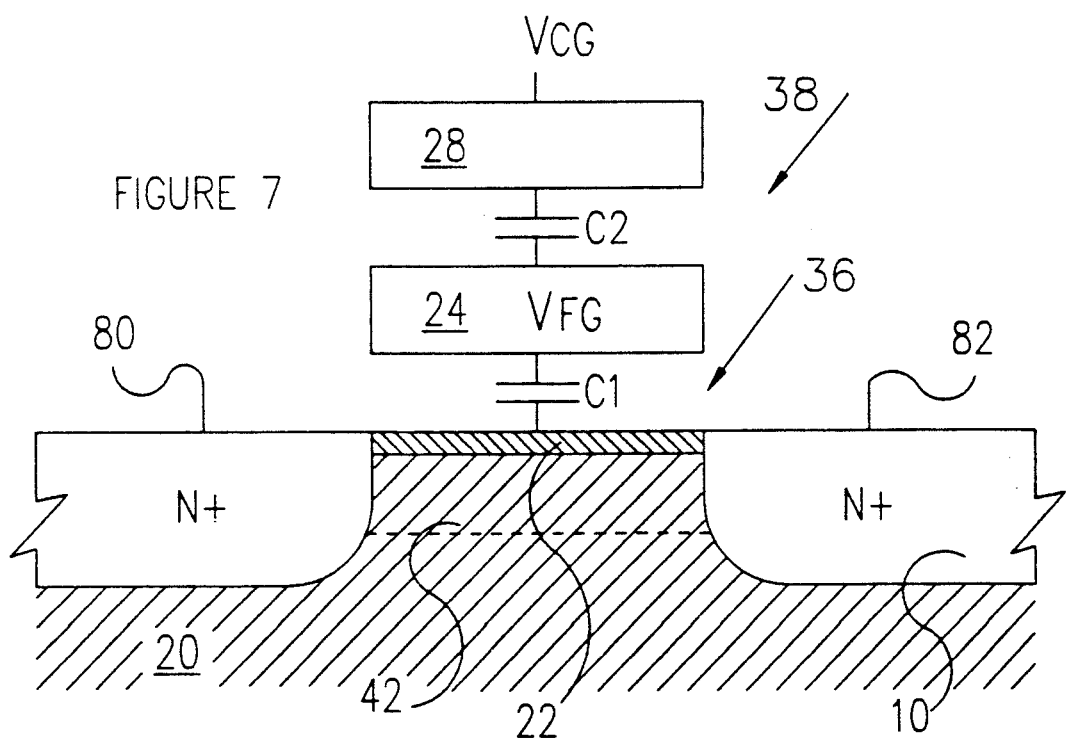
FIG. 7 is a schematic representation of the floating gate memory cell.

The capacitors are shown in FIG. 7. The charge on the floating gate is proportional to V$_{fg}$, and V$_{cg}$ is the programming voltage, i.e., about 12 volts.

It can be seen that the floating gate voltage V$_{fg}$ is proportional to the capacitance of C2 which in turn is proportional to the surface area of the second polysilicon layer 26. Consequently, the capacitance of C2 is controlled by, and is proportional to the depth 40 of oxide layer 34 and inversely proportional to the thickness of ONO layer 18.

Another important electrical characteristic of a floating gate FET is the channel and channel length L$_{eff}$. As described supra, it is desirable to avoid short channel effects. The semicircular channel is shown at 42 and is bounded on the ends at 44 and 46 where it intersections diffusion 16. It can again be seen that the L$_{eff}$ of channel 42 can be controlled by the depth of penetration of the well 14 into substrate 20. In this case, there is a trade off, i.e., while it may be desirable to increase L$_{eff}$ (channel length), it is also desirable to minimize C1 which unfortunately increases with the length of channel 42. This effect can be compensated by increasing length 40.

The final steps and materials consist of an insulating layer of silicon dioxide which is etched to provide contact windows followed by depositing and etching of aluminum conductors. These two surfaces are not shown in the figures.

Oxide Cut Method

Figure 6:
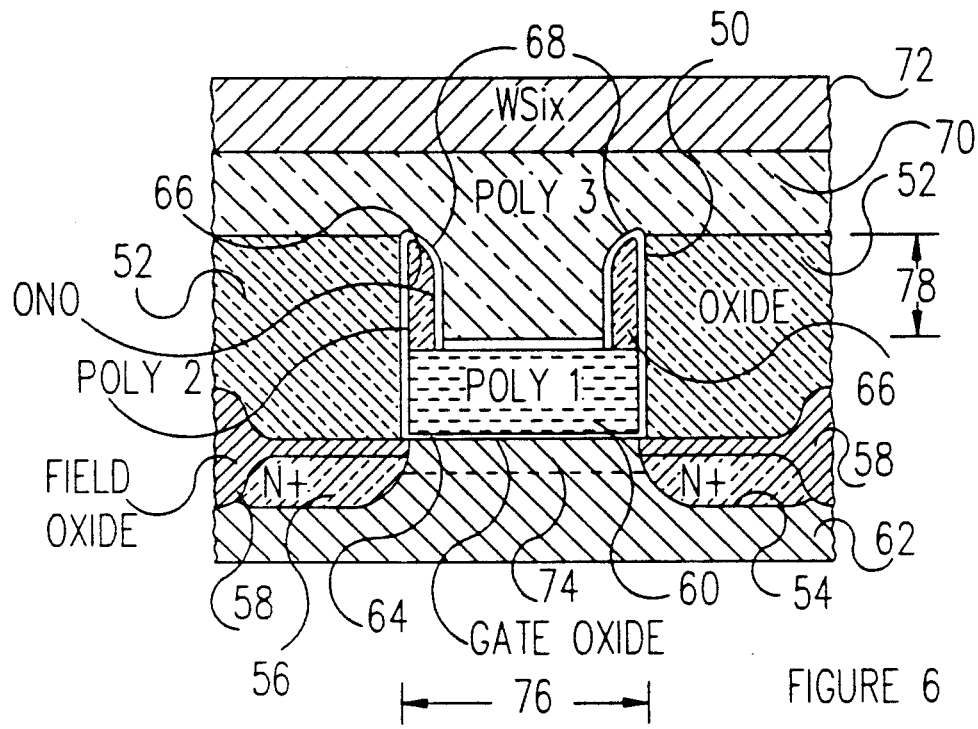
FIG. 6 is a section view of the oxide cut memory cell taken along lines 6—6 of FIG. 4.

A second embodiment is described as an oxide cut method, named for the process of only cutting a well into the oxide layer and not into the underlying substrate. FIGS. 4-6 illustrate this configuration. In this case, the plug contact well 50 is contained within an oxide layer 52 between continuous N+ diffusion lines 54 and 56 and over a field oxide 58. The first layer polysilicon forms floating gate 60 which is electrically insulated from substrate 62 by a thin gate/tunnel oxide layer 64. Again, in this case, the second polysilicon layer 66, a cylindrical shape, is formed above the floating gate 60 and has an insulating ONO layer 68, acting as a dielectric between the second polysilicon layer 66 and a third polysilicon layer control gate 70, which is covered by tungsten silicide conductor 72.

As previously described, capacitor C2 would be formed between polysilicon layer 66 and polysilicon gate 70, and C1 would be formed between floating gate 60 and substrate channel 74. In this case, we have formed a shorter channel L$_{eff}$ at 76 and a smaller capacitance C2 as controlled by oxide 52 height above the floating gate 60 as at 78.

FIG. 7 shows schematically the capacitor C1, at 36 between the floating gate 24 and substrate 20, and C2, at 38 between control gate 28 and floating gate 24 located above the channel 42 and between source and drain 80 and 82.

Figure 2:
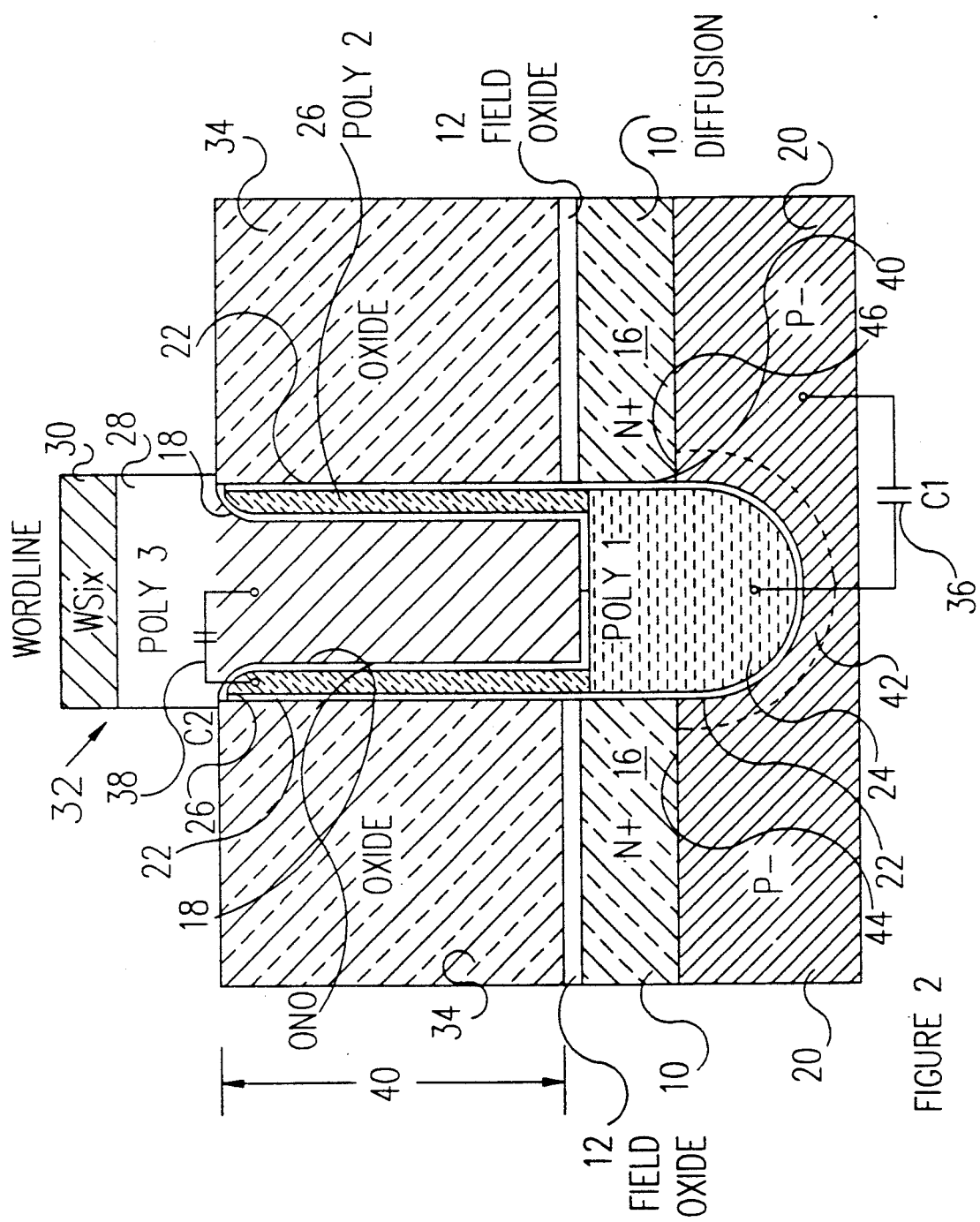
FIG. 2 is a section view of the memory cell taken along lines 2—2 of FIG. 1.

Referring back to the diffusion cut cell of FIGS. 1-3, this cell has some interesting potential for programming options. The region where floating gate 24 and drain in diffusion 16 at 90 can be used to tunnel (a quantum mechanics phenomenon) electrons between this gate and the drain for programming (write function) or erase function.

It is also possible to perform drain or channel engineering functions to improve the cell electrical characteristics by adding implants and masks during N+ diffusion formation, i.e., implant a dopant to only one of the N+ diffusions.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of fabricating a minimum area floating gate memory cell within an IC chip contact well comprising the steps of:

a. growing and patterning a field oxide on a substrate by a LOCOS process;

b. implanting an impurity element in the substrate to form a diffusion region adjacent the field oxide;

c. depositing an oxide layer over the diffusion region and field oxide;

d. patterning and etching a contact well in the oxide layer, field oxide, diffusion region, and substrate further comprising:
   i. performing a cell plug masking;
   ii. etching the oxide layer;
   iii. etching the silicon and diffusion region, thereby forming an extended channel;

e. growing a gate/tunnel oxide layer within the contact well;

f. depositing and doping a first polysilicon layer with the contact well, thereby forming a floating gate and capacitor C1;

g. etching the first polysilicon layer until the only polysilicon is within the contact well forming a polysilicon plug;

h. depositing a second polysilicon layer within the contact well;

i. etching back the second polysilicon layer leaving a thin layer of the second polysilicon on a perimeter of the contact well;

j. depositing an ONO dielectric layer over the second polysilicon layer wherein the ONO dielectric layer is about 100 Å thick;

k. depositing and doping a third polysilicon layer over the contact hole, thereby forming a second capacitor C2 between the third polysilicon layer and the second polysilicon layer wherein a capacitance ratio of C2/C1 is maximized by controlling a depth of the oxide layer of step c, thereby providing a maximum voltage and charge on the floating gate during electrical programming;

l. depositing a tungsten silicide layer over the third polysilicon layer; and then m. masking and etching the third polysilicon layer and tungsten silicide to form a word line.

2. A method of fabricating a minimum area floating gate memory cell within an IC chip contact well comprising the steps of:

a. growing and patterning a field oxide on a substrate by a LOCOS process;

b. implanting an impurity element in the substrate to form a diffusion region adjacent the field oxide;

c. depositing an oxide layer over the diffusion region and field oxide;

d. patterning and etching a contact well in the oxide layer further comprising:
   i. performing a cell plug masking;
   ii. etching the oxide layer;
   iii. etching the silicon and diffusion region, thereby forming an extended channel;

e. growing a gate/tunnel oxide layer within the contact well, thereby forming a floating gate and a capacitor C1 between the first polysilicon layer and the substrate, said capacitor C1 having a minimal capacitance;

f. depositing and doping a first polysilicon layer within the contact well, thereby forming a floating gate and capacitor C1;

g. etching the first polysilicon layer until the only polysilicon is within the contact well forming a polysilicon plug;

h. depositing a second polysilicon layer within the contact well;

i. etching back the second polysilicon layer leaving a thin layer of the second polysilicon on a perimeter of the contact well;

j. depositing an ONO dielectric layer over the second polysilicon layer wherein the ONO dielectric layer is about 100 Å thick;

k. depositing and doping a third polysilicon layer over the contact hole, thereby forming a second capacitor C2 between the third polysilicon layer and the second polysilicon layer C2 having a larger capacitance than C1;

l. depositing a tungsten silicide layer over the third polysilicon layer; and then m. masking and etching the third polysilicon layer and tungsten silicide to form a control gate and word line.

* * * * *